United States Patent [19]
Yamagata et al.

[11] Patent Number: 5,366,564
[45] Date of Patent: Nov. 22, 1994

[54] HARD WEAR-RESISTANT FILM AND METHOD FOR PRODUCTION THEREOF

[75] Inventors: Hiroshi Yamagata, Toyama; Akihisa Inoue, 11-806, Kawauchijutaku, Mubanchi, Kawauchi Aoba-ku, Sendai-shi, Miyagi-ken; Tsuyoshi Masumoto, Sendai, all of Japan

[73] Assignees: Yoshida Kogyo K.K., Tokyo, Japan; Ysuyoshi Masumoto; Akihisa Inoue, both of Miyagi, Japan

[21] Appl. No.: 120,735

[22] Filed: Sep. 14, 1993

[30] Foreign Application Priority Data

Sep. 16, 1992 [JP] Japan .................. 4-270807

[51] Int. Cl.$^5$ .................. C22C 21/00
[52] U.S. Cl. .................. 148/403; 148/518; 148/902; 204/192.11; 204/192.12; 204/192.16; 428/654
[58] Field of Search .................. 148/403, 518, 902; 204/192.11, 192.12, 192.16; 428/654

[56] References Cited

U.S. PATENT DOCUMENTS 5,015,308  5/1991  Yamagata ............... 148/403
5,076,865 12/1991  Hashimoto et al. ....... 148/403
5,123,980  6/1992  Hashimoto et al. ....... 148/403

FOREIGN PATENT DOCUMENTS 1-275732 11/1989 Japan .

Primary Examiner—Richard O. Dean
Assistant Examiner—Robert R. Koehler
Attorney, Agent, or Firm—Hill, Steadman & Simpson

[57] ABSTRACT

A hard wear-resistant film is formed on a substrate in an atmosphere of an inert gas by using a target of a composition of $Al_aTi_b$ (wherein "a" and "b" stand for atomic percentages respectively in the ranges of 62 at $\% \leq a \leq 85$ at % and 15 at $\% \leq b \leq 38$ at %, providing a+b=100 at %) or $Al_cTa_d$ (wherein "c" and "d" stand for atomic percentages respectively in the ranges of 60 at $\% \leq c \leq 80$ at % and 20 at $\% \leq d \leq 40$ at %, providing c+d=100 at %) and by a sputtering process or ion plating process while varying continuously or stepwise the feed rate of a nitrogen-containing reaction gas into a chamber. The film consequently formed has a composition and structure thereof continuously or stepwise varied from a substantially amorphous metal of a part being in contact with the substrate to an (Al, Ti)N or (Al, Ta)N crystalline ceramic phase with the nitrogen content continuously or stepwise increased in the direction of the surface of the film.

14 Claims, 11 Drawing Sheets

HARD WEAR-RESISTANT FILM AND METHOD FOR PRODUCTION THEREOF

BACKGROUND OF THE INVENTION

1. Field of the Invention

This invention relates to a hard wear-resistant film possessed of a surface of high hardness and a method for the production thereof and, more particularly, to a method for producing, without requiring to preheat a substrate, a dense hard wear-resistant film furnished with good fast adhesiveness to a substrate and possessed of a hard ceramic surface and to a composition of the film.

2. Description of the Prior Art

For the coating intended to protect machine parts and tools against wear and scratch, such materials as TiN, TiC, WC, and (Ti,Al)N have been popularly in used. In the coating of a substrate with the film of such a material, the practice of preheating the substrate for the purpose of improving the adhesiveness of the film to the substrate and enhancing the denseness of the film has been in vogue. Since this preheating is carried out at a temperature exceeding at least 200° C., the material which is usable for the substrate has its own limit. Thus, such a material as aluminum alloy which suffers the mechanical properties thereof to be seriously deteriorated by preheating cannot be used for the substrate.

Heretofore, amorphous alloy materials which are excellent in such characteristics as strength and ability to resist heat have been produced as by the liquid quenching technique. The aluminum-based amorphous alloy material, which is obtained by the liquid quenching method, disclosed in published Japanese Patent Application, KOKAI (Early Publication) No. 1-275,732 particularly excels in strength, resistance to heat, and resistance to corrosion. Though the amorphous alloy materials generally excel other metallic materials in such characteristic properties as strength, they will have room for further improvement as compared with such materials as ceramics. Notwithstanding the ceramic materials indeed excel in such characteristic properties as strength and hardness, they cannot be used for such applications as are in need of high toughness. They are particularly required to have high toughness when they are to be used in the form of thin film.

SUMMARY OF THE INVENTION

The present invention, therefore, has an object of providing a method which allows inexpensive production by a simple procedure of a dense film exhibiting good adhesiveness to a substrate such that the film, even when it is formed on the substrate which has not been heated in advance of the coating, will neither sustain a crack in the boundary between the film and the substrate nor induce separation of the film from the substrate.

Another object of the present invention is to provide a dense, hard, and wear-resistant film possessing a surface of high hardness, which film excels in adhesiveness to a substrate, exhibits higher strength than the aforementioned amorphous alloy material, and enjoys alleviation of the brittleness which constitutes itself a drawback of the aforementioned ceramic materials.

To accomplish the objects described above, according to the present invention, there is provided a hard wear-resistant film characterized by having the composition and structure thereof obliquely varied from a substantially aluminum-based amorphous metal to an (Al M)N crystalline ceramic phase (wherein M is a metal selected from the group consisting of titanium and tantalum) with the nitrogen content increased continuously or stepwise in the direction of the surface of the film.

In accordance with a first aspect of the present invention, there is provided a hard wear-resistant film characterized by having the composition and structure thereof obliquely varied from a substantially amorphous metal of the composition of $Al_aTi_b$ (wherein "a" and "b" stand for atomic percentages respectively in the ranges of 62 at $\% \leq a \leq 85$ at $\%$ and 15 at $\% \leq b \leq 38$ at $\%$, providing a+b=100 at $\%$) to an (Al, Ti)N crystalline ceramic phase with the nitrogen content increased in the direction of the surface of the film.

In accordance with a second aspect of the present invention, there is provided a hard wear-resistant film characterized by having the composition and structure thereof obliquely varied from a substantially amorphous metal of the composition of $Al_cTa_d$ (wherein "c" and "d" stand for atomic percentages respectively in the ranges of 60 at $\% \leq c \leq 80$ at $\%$ and 20 at $\% \leq d \leq 40$ at $\%$, providing c+d=100 at $\%$) to an (Al, Ta)N crystalline ceramic phase with the nitrogen content increased in the direction of the surface of the film.

Preferably the nitrogen content in the film may be increased continuously or stepwise in the direction of the surface of the film.

Further in accordance with the present invention, there are provided methods for the production of said hard wear-resistant films. In accordance with a third aspect of the present invention, there is provided a method for the production of a hard wear-resistant film, comprising the steps of setting in place a substrate and a material of the composition of $Al_aTi_b$ (wherein "a" and "b" have the same meanings as defined above) as a source of evaporation in a chamber and effecting deposition of the film on the substrate in an atmosphere of an inert gas containing a nitrogen-containing reaction gas while varying the feed rate of the reaction gas into the chamber thereby giving rise to the film having the composition and structure thereof obliquely varied from a substantially amorphous phase in the part contacting said substrate to an (Al, Ti)N crystalline ceramic phase forming the surface of said film.

In accordance with a fourth aspect of the present invention, there is provided a method for the production of a hard wear-resistant film, comprising the steps of setting in place a substrate and a material of the composition of $Al_cTa_d$ (wherein "c" and "d" have the same meanings as defined above) as a source of evaporation in a chamber and effecting deposition of the film on the substrate in an atmosphere of an inert gas containing a nitrogen-containing reaction gas while varying the feed rate of the reaction gas into the chamber thereby giving rise to the film having the composition and structure thereof obliquely varied from a substantially amorphous phase in the part contacting said substrate to an (Al, Ta)N crystalline ceramic phase forming the surface of said film.

In both methods, preferably, the deposition of the film on the substrate is carried out by a sputtering process or an ion plating process and the feed rate of the reaction gas into the chamber is varied continuously or stepwise.

BRIEF DESCRIPTION OF THE DRAWINGS

Other objects, features, and advantages of the invention will become apparent from the following description taken together with the drawings, in which.

DETAILED DESCRIPTION OF THE INVENTION

Figure 1:
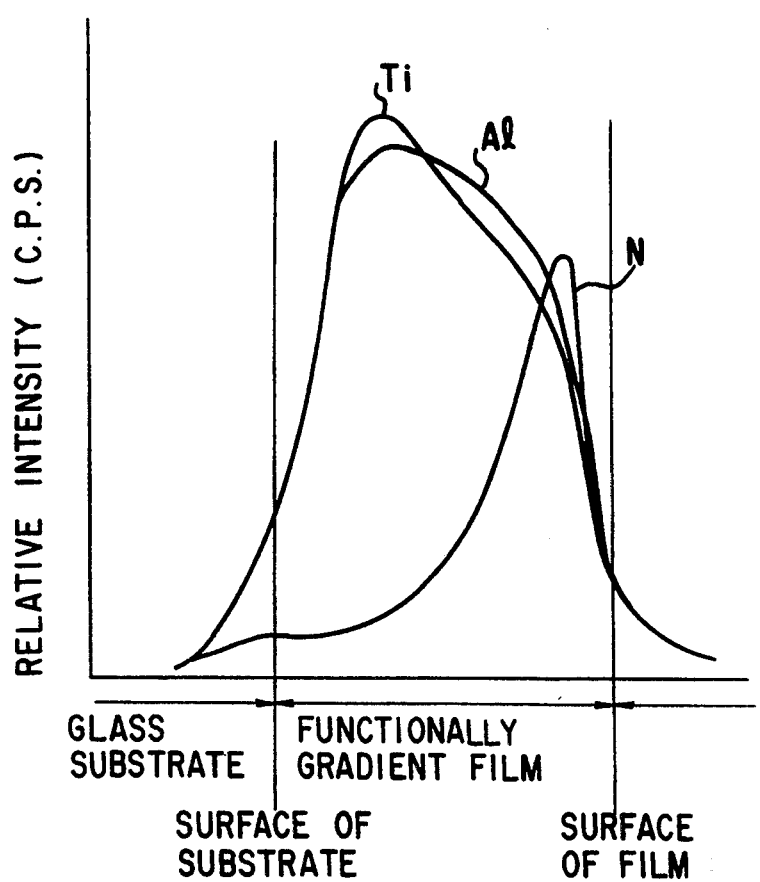
FIG. 1 is a line profile showing the variation of composition determined by the EDX (energy dispersive X-ray spectroscopy) in the section of an $(Al_{80}Ti_{20})_{100-x}N_x$ functionally gradient film prepared in Example 1 to be described hereinafter.

The present invention is characterized by using as a target (source of evaporation) in the formation of a film on a substrate by the sputtering technique or the ion plating technique an Al—Ti or Al—Ta composition which forms a substantially amorphous metallic film where no reaction gas is introduced into a reaction chamber or a crystalline ceramic film where nitrogen gas or the like is introduced thereinto as a reaction gas.

To be specific, when a film is formed on a substrate in an atmosphere of an inert gas by using a target of the composition of $Al_aTi_b$ (wherein "a" and "b" stand for atomic percentages respectively in the ranges of 62 at $\% \leq a \leq 85$ at % and 15 at $\% \leq b \leq 38$ at %, providing $a+b=100$ at %) or $Al_cTa_d$ (wherein "c" and "d" stand for atomic percentages respectively in the ranges of 60 at $\% \leq c \leq 80$ at % and 20 at $\% \leq d \leq 40$ at %, providing $c+d=100$ at %) and varying continuously or stepwise the feed rate of nitrogen gas into the chamber, the film consequently formed has the composition and structure thereof continuously or stepwise varied from a substantially amorphous metal of the part being in contact with the substrate to an (Al, Ti)N or (Al, Ta)N crystalline ceramic phase with the nitrogen content continuously or stepwise increased in the direction of the surface of the film.

When the Al—Ti target has an Al content of not less than 80 at %, the vaporization using a partial pressure of nitrogen in the range of 0 to 0.021Pa produces aluminum crystals. These crystals are in a state in which they are dispersed in an amorphous metal. The expression "substantially amorphous metal" used herein shall be construed as embracing such a structure. When the nitrogen concentration is increased to reach the range of 0.021 to 0.04 Pa, the film consists of an amorphous metal. When the nitrogen concentration exceeds 0.04 Pa, the film changes to a final ceramic crystalline phase composed of a solid solution of Ti in AlN crystals.

Thus, by coating a substrate with an (Al, Ti)N or (Al, Ta)N functionally gradient film having the nitrogen content continuously increased from the substrate side to the surface of the film in accordance with the present invention, the occurrence of cracking or separation in the interface between the substrate and the film can be prevented and the adhesiveness of the film to the substrate can be improved without requiring the substrate to be heated in advance of the coating. Further, the film does not allow growth of a columnar structure of the kind which is observed in a crystalline film formed by the same composition but acquires as extremely dense structure by causing the structure of the film to be varied continuously or stepwise from an amorphous to a crystalline structure in the direction from the substrate side to the surface of the film. The adhesiveness of the film to the substrate cannot be degraded by increasing the thickness of the final ceramic layer in the surface part of the film.

As means for effecting the deposition described above, the reactive sputtering process and the ion plating process may be cited. The source of evaporation may be a single source of evaporation using compounds or mixtures which contain compositions in a prescribed ratio. Where a plurality of sources of evaporation are used, each of them may be a material having a single composition or a material containing different compositions. In this case, all the sources of evaporation are operated by a method which causes them to evaporate simultaneously.

The supply of the reaction gas such as nitrogen gas is carried out by a method which comprises continuously varying the rate of supply or a method which comprises varying stepwise the rate of supply with the volume of supply kept at a fixed level, for example. To be specific, the (Al, Ti)N or (Al, Ta)N film of the present invention having the structure thereof continuously or stepwise varied from an amorphous to a crystalline structure in the direction from the substrate side to the surface of the film can be obtained by introducing a sputter gas (an inert gas such as Ar, He, Ne, Xe, or Kr) into a deposition chamber and keeping the total gas pressure therein at a low level in the range of 0.6 to 1.2 Pa and then performing the coating operation in the chamber while causing the feed rate of reaction gas such as $N_2$ and NH₃ being supplied thereto to be continuously or stepwise increased so that the concentration of nitrogen relative to the inert gas will vary gradually in the range of 0 to 20% by volume.

Though the method of the present invention is particularly useful in coating a substrate made of a macromolecular material or an aluminum material which by nature is incapable of withstanding temperatures exceeding 200° C., it can be applied to substrates of other materials as a matter of course.

As described in detail above, the method contemplated by the present invention enables a dense wear-resistant film exhibiting good adhesiveness to a substrate and having a surface of high hardness to be produced without requiring the substrate to be heated prior to the coating step and with no addition of any special step to the process of coating.

The film to be obtained by the present invention is a hard wear-resistant film possessed of an unusually dense structure and a surface of high hardness and having the composition and structure thereof varied continuously or stepwise from the substantially amorphous metal on the substrate to the (Al, Ti)N or (Al, Ta)N crystalline ceramic phase with the nitrogen content thereof continuously or stepwise increased in the direction of the surface of the film. Since this film exhibits outstanding mechanical and electrical properties and, at the same time, enjoys alleviation of the brittleness which forms a drawback of ceramic materials, it can be used as electric and electronic materials, high-strength materials, wear-resistant materials, and highly refractory materials and find extensive utility in numerous industrial fields.

Now, the present invention will be described more specifically below with reference to working examples.

EXAMPLE 1

A target made of an alloy of (80 at % Al-20 at % Ti) was set in place as opposed to an electrode (+pole) inside a magnetron sputter deposition device and a substrate made of a glass plate to be subjected to deposition was disposed between the electrode and the target at a distance of 60 mm from the target. The sputter device was evacuated by means of a vacuum pump and then supplied with argon gas until the total gas pressure inside the device reached 1 Pa.

Preparatorily to the coating operation, a high frequency power source was connected to a jig serving to fix the glass substrate in place and an electric power of 80 W was applied to the jig to effect sputter-etching of the glass substrate for 10 minutes.

Then, a DC power source was connected to the target and an electric current of 0.3 A was applied to the target 75 mm in diameter to effect preliminary discharge for 10 minutes. At this time, a stainless steel plate as a shutter was set in place in front of the glass substrate so as to prevent the glass substrate from the coating due to the preliminary discharge. This preliminary discharge had a purpose of removing the gas or moisture adhering to the surface of the target.

After this preliminary discharge was completed, the shutter was removed and the coating of the glass substrate was started. The substrate was not heated prior to the coating.

While the coating was in process, the flow rate of the nitrogen gas introduced as a reaction gas into the device was continuously varied from 0 SCCM (standard cubic centimeter) to 6.1 SCCM over a period of 180 minutes by means of an electrically controllable flow rate adjusting meter. In this period, the partial pressure of nitrogen varied from 0 Pa to 0.102 Pa.

The film obtained as a result had an overall thickness 5 μm. By observation through an electron microscope, it was found that the section of this film had a dense structure and showed no columnar structure.

FIG. 1 represents the results of linear analysis performed by the EDX (energy dispersive X-ray spectrometry), which show a change in each component found in the section of the film obtained. As clearly noted from FIG. 1, the nitrogen content in the film continuously increased from the upper surface of the glass substrate to the surface of the film.

Figure 2:
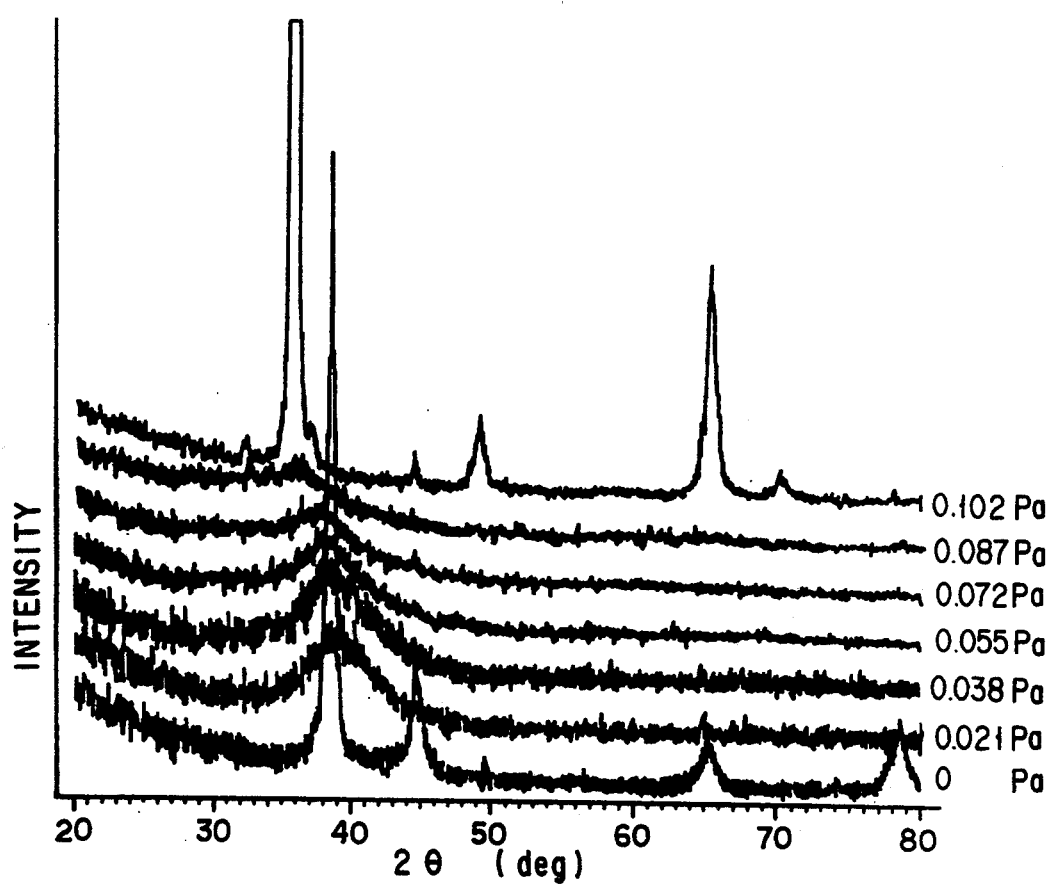
FIG. 2 is a diagram showing X-ray diffraction patterns obtained of films of varying uniform compositions of $(Al_{80}Ti_{20})_{100-x}N_x$ produced at varying prescribed partial pressures of nitrogen, with the X-ray diffraction patterns illustrated as shifted in the direction of intensity in the order in which the partial pressures of nitrogen increase.

FIG. 2 represents the results of analysis performed by the X-ray diffraction on films of uniform composition produced at varying prescribed partial pressures of nitrogen. The X-ray diffraction patterns of the films of varying uniform compositions are collectively shown as shifted in the order in which the relevant partial pressures of nitrogen increase in the direction of intensity of the vertical axis of the coordinates system to facilitate comprehension. It is clearly noted from FIG. 2 that the data shown therein indicate that the metallic film obtained in the absence of nitrogen gas consisted of aluminum crystals and that the film acquired an amorphous structure when the partial pressure of nitrogen was 0.021 Pa and the film changed from an amorphous structure to a crystalline structure when the partial pressure of nitrogen further increased.

Figure 3:
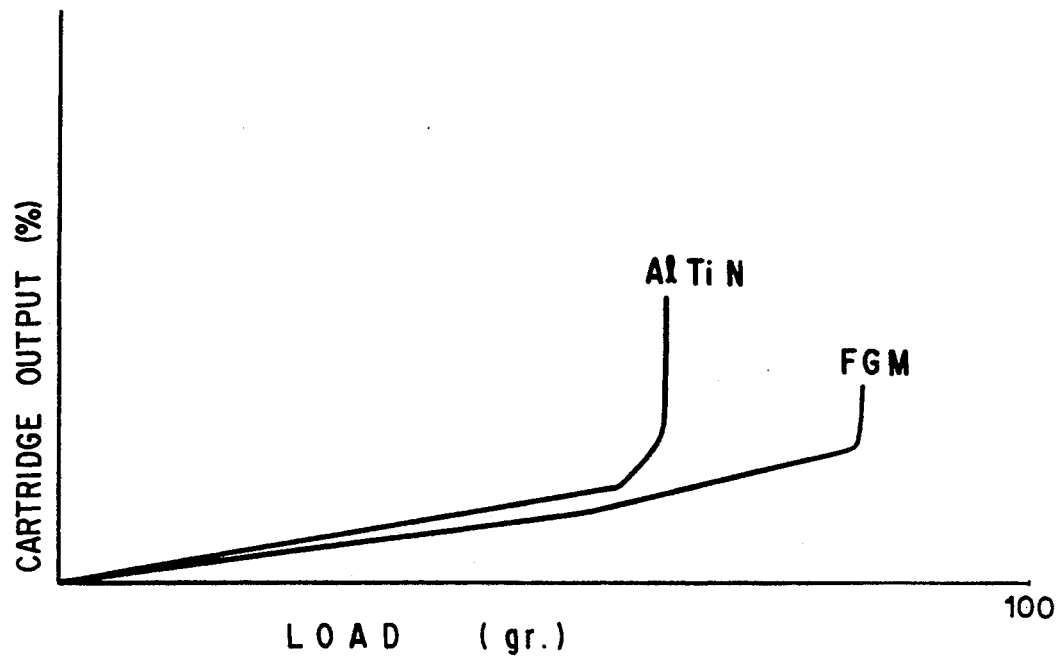
FIG. 3 is a graph showing the results of a test for adhesiveness performed on indicated species of film by the scratching method.

FIG. 3 represents the results of a test for adhesiveness performed on films by the scratch method using a scanning type scratch tester (manufactured by Shimazu Seisakusho Ltd. and marketed under product code of "SST-101"). Not only the functionally gradient film (FGM) produced in Example 1 but also a film of uniform nitride composition (AlTiN) produced for comparison is covered by the data of FIG. 3. The adhesiveness of film is shown in terms of a cartridge output which varies proportionately with an increase of load and the point at which this output suddenly increases represents the separation of the film from the substrate. It is clearly noted from FIG. 3 that the functionally gradient film enjoyed a generous improvement in adhesiveness as compared with the single-layer uniform film. The film of uniform nitride composition used for the purpose of comparison was a film formed under the final conditions used for the functionally gradient film of Example 1 and had hardness of 2,300 Hk.

Figure 4:
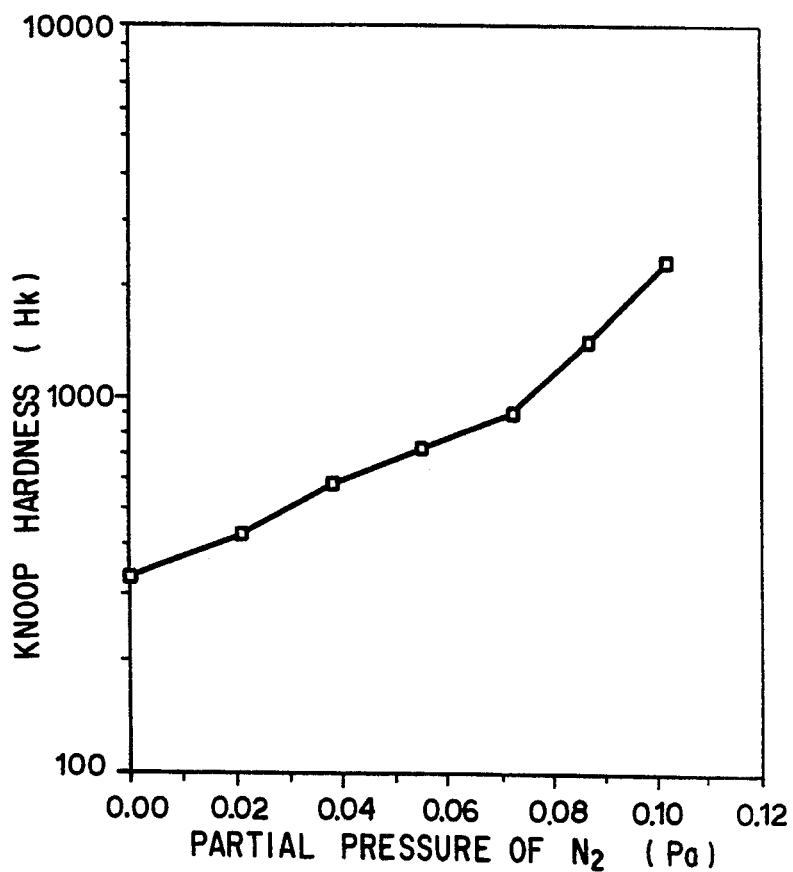
FIG. 4 is a graph showing the relation between the Knoop hardness and the partial pressure of nitrogen obtained of a film of uniform composition of $(Al_{80}Ti_{20})_{100-x}N_x$.

FIG. 4 represents the results of a test for hardness formed on films formed at varying prescribed partial pressures of nitrogen. The hardness was determined with a microhardness tester on a uniform film formed at a prescribed partial pressure of nitrogen. It is clearly noted from FIG. 4 that the hardness increased proportionately with an increase in the partial pressure of nitrogen and that the hardness of the film formed at a partial pressure of nitrogen of 0.102 Pa was 2,300 Hk.

EXAMPLE 2

A target made of an alloy of (64 at % Al-36 at % Ti) was set in place as opposed to an electrode (+pole) inside a magnetron sputter deposition device and a substrate made of a glass plate or aluminum plate to be subjected to deposition was disposed between the electrode and the target at a distance of 60 mm from the target to deposite a film on each plate. The sputter device was evacuated by means of a vacuum pump and then supplied with argon gas until the total gas pressure inside the device reached 1 Pa.

Preparatorily to the coating operation, a high frequency power source was connected to a jig serving to fix the glass substrate or aluminum substrate in place and an electric power of 80 W was applied to the jig to effect sputter-etching of the glass substrate or the aluminum substrate for 10 minutes.

Then, a DC power source was connected to the target and an electric current of 0.3 A was applied to the target 75 mm in diameter to effect preliminary discharge for 10 minutes. At this time, a stainless steel plate as a shutter was set in place in front of the glass substrate or the aluminum substrate so as to prevent the glass substrate or the aluminum substrate from the coating due to the preliminary discharge.

After this preliminary discharge was completed, the shutter was removed and the coating of the glass substrate or the aluminum substrate was started. The substrate was not heated prior to the coating.

While the coating was in process, the flow rate of the nitrogen gas introduced as a reaction gas into the device was continuously varied from 0 SCCM (standard cubic centimeter) to 4.1 SCCM over a period of 180 minutes by means of an electrically controllable flow rate adjusting meter. In this while, the partial pressure of nitrogen varied from 0 Pa to 0.074 Pa.

The film obtained as a result had an overall thickness of 5 $\mu$m. By observation through an electron microscope, it was found that the section of this film had a dense structure and showed no columnar structure.

The film deposited on the glass substrate was subjected to linear analysis by the EDX and X-ray diffraction and the film deposited on the aluminum substrate was tested for hardness and bending property.

Figure 5:
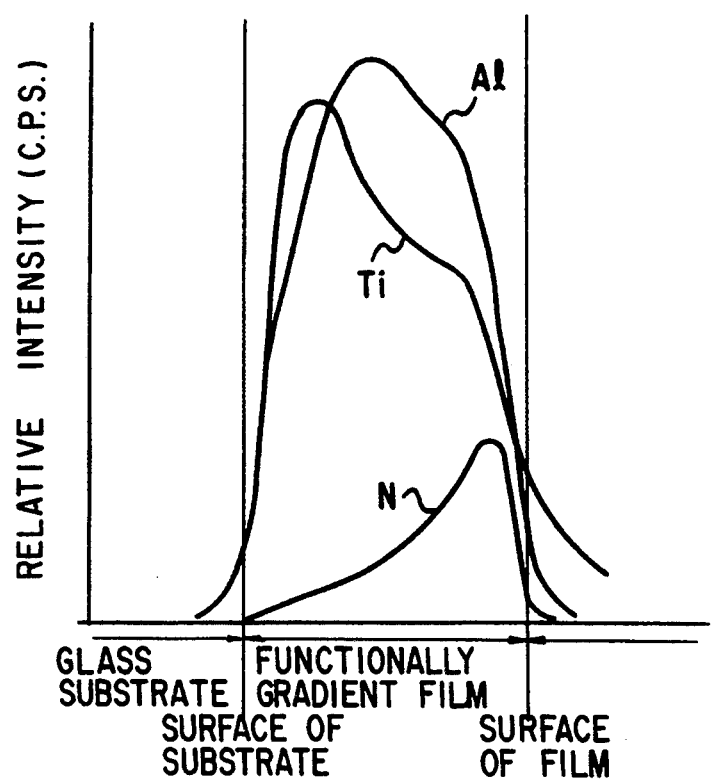
FIG. 5 is a line profile showing the variation of composition determined by the EDX in the section of an $(Al_{64}Ti_{36})_{100-x}N_x$ functionally gradient film prepared in Example 2 to be described hereinafter.
Figure 6A:
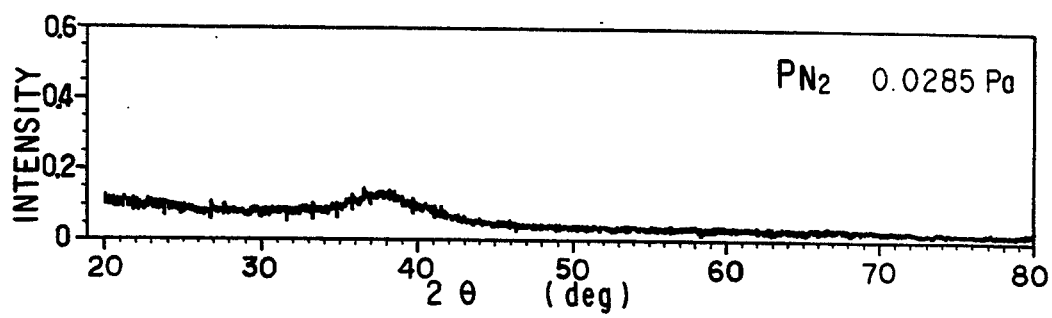
FIGS. 6A through 6H are diagrams showing the X-ray diffraction patterns obtained of films of varying uniform compositions of $(Al_{64}Ti_{36})_{100-x}N_x$ produced at the partial pressures of nitrogen of 0.0285 Pa, 0.0333 Pa, 0.0378 Pa, 0.0406 Pa, 0.0415 Pa, 0.0424 Pa, 0.0452 Pa, and 0.047 Pa, respectively.
Figure 6B:
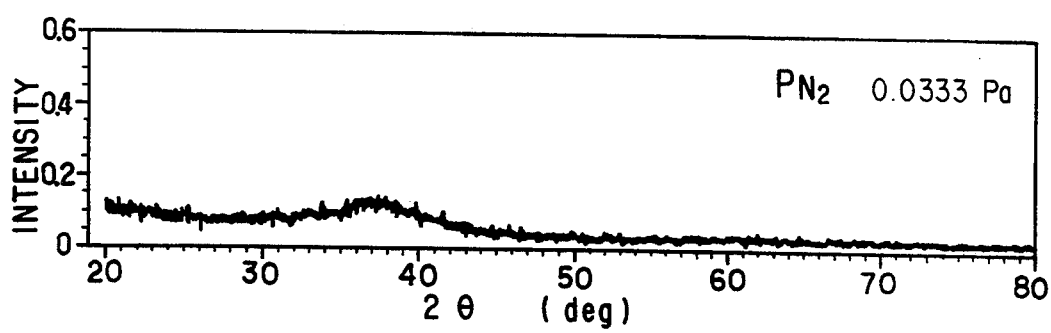
Figure 6C:
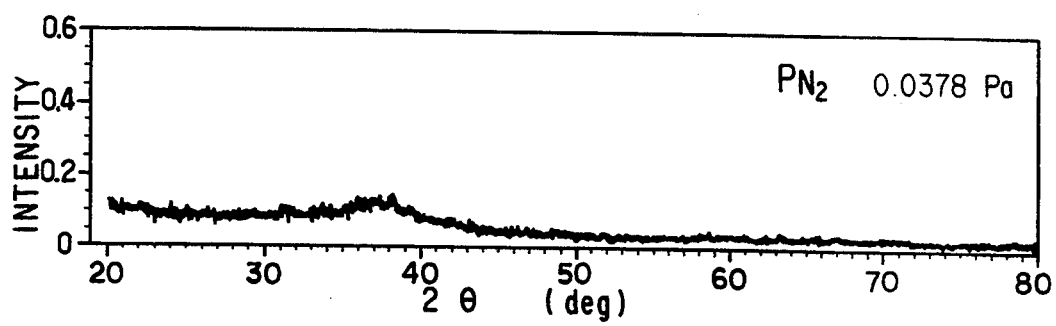
Figure 6D:
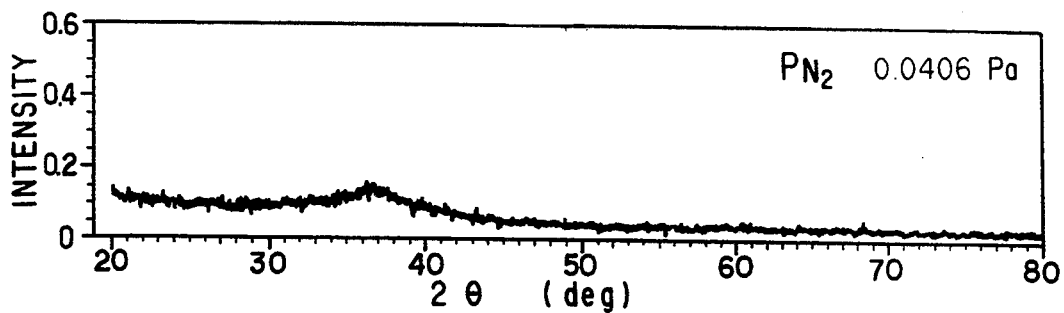
Figure 6E:
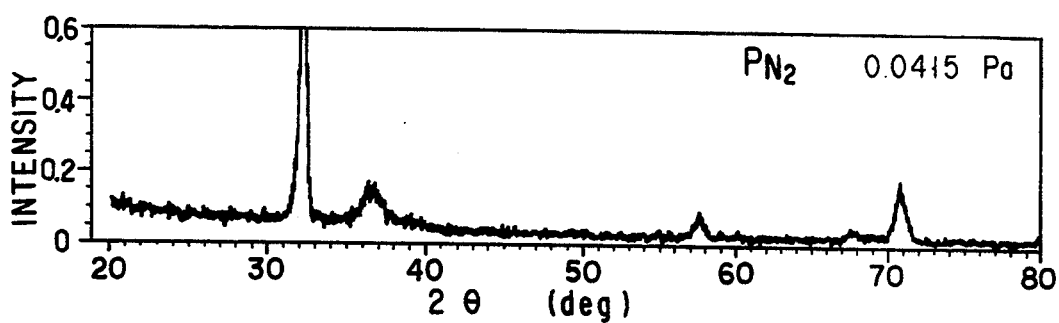
Figure 6F:
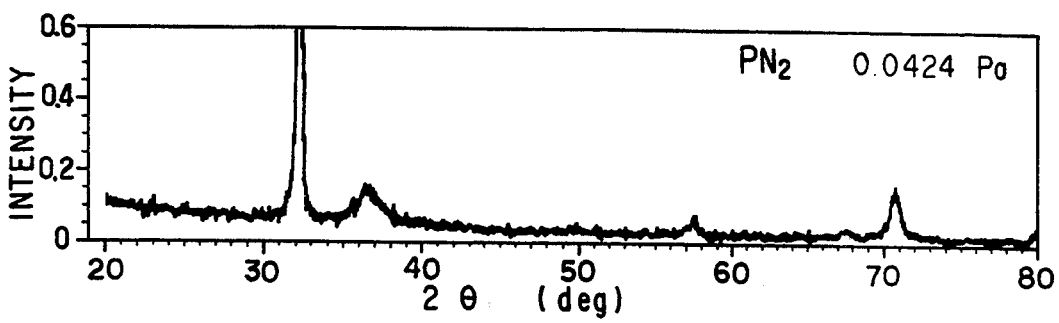
Figure 6G:
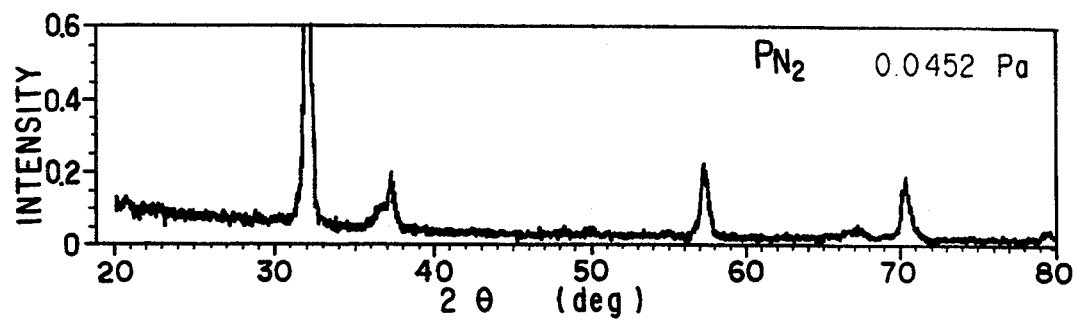
Figure 6H:
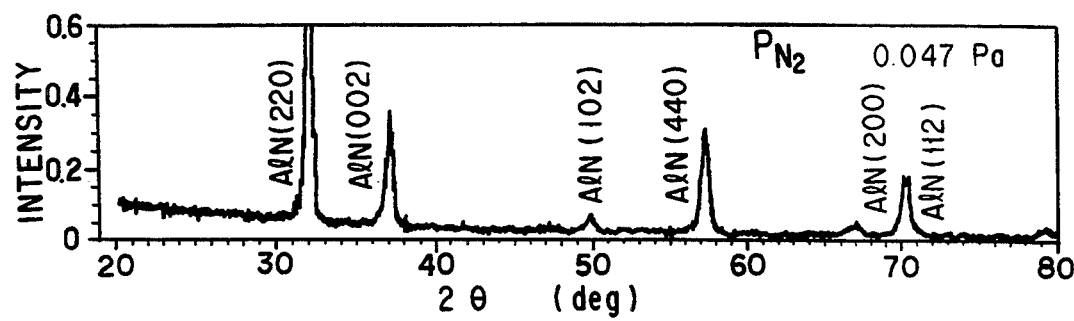

FIG. 5 represents the results of linear analysis performed by the EDX, which show a change in each component found in the section of the film obtained. As clearly noted from FIG. 5, the nitrogen content in the film continuously increased from the upper surface of the glass substrate to the surface of the film.

FIGS. 6A to 6H represent the results of analysis performed by X-ray diffraction on films of uniform composition produced at varying prescribed partial pressures of nitrogen. It is clearly noted from these X-ray diffraction patterns that the film consisted of an amorphous metal at a partial pressure of nitrogen of 0 Pa and it changed from an amorphous to a crystalline structure in consequence of an increase in the partial pressure of nitrogen.

Figure 7:
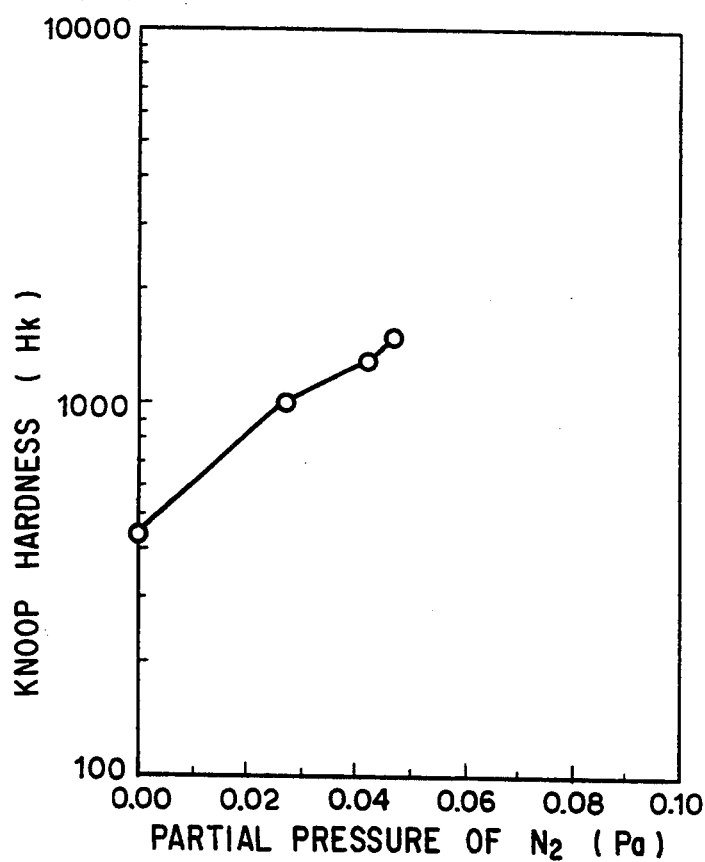
FIG. 7 is a graph showing the relation between the Knoop hardness and the partial pressure of nitrogen obtained of a film of uniform composition of $(Al_{64}Ti_{36})_{100-x}N_x$.

FIG. 7 shows the results of a test for hardness formed on films formed at varying prescribed partial pressures of nitrogen. The hardness was determined with a microhardness tester on a uniform film formed at a prescribed partial pressure of nitrogen. It is clearly noted from FIG. 7 that the hardness increased proportionately with an increase in the partial pressure of nitrogen and that the hardness of the film formed at a partial pressure of nitrogen of 0.047 Pa was 1,500 Hk.

The adhesiveness of the film to the substrate was evaluated by a bending test using a substrate of aluminum. For comparison, a hard film of uniform composition 5 $\mu$m in thickness which was formed at a partial pressure of nitrogen fixed at 0.074 Pa was used. By the bending test, the film according to the present invention was found to sustain a crack but induce no separation of itself from the substrate. In contrast thereto, the hard film for comparison was separated from the substrate in the process of the bending test.

EXAMPLE 3

A target made of an alloy of (75 at % Al-25 at % Ta) was set in place as opposed to an electrode (+pole) inside a magnetron sputter deposition device and a substrate made of an aluminum plate to be subjected to deposition was disposed between the electrode and the target at a distance of 60 mm from the target. The sputter device was evacuated by means of a vacuum pump and then supplied with argon gas until the total gas pressure inside the device reached 1 Pa.

Preparatorily to the coating operation, a high frequency power source was connected to a jig serving to fix the aluminum substrate in place and an electric power of 100 W was applied to the jig to effect sputter-etching of the aluminum substrate for 10 minutes.

Then, a DC power source was connected to the target and an electric current of 0.4 A was applied to the target 100 mm in diameter to effect preliminary discharge for 10 minutes. At this time, a stainless steel plate as a shutter was set in place in front of the aluminum substrate so as to prevent the aluminum substrate from the coating due to the preliminary discharge. This preliminary discharge had a purpose of removing the gas or moisture adhering to the surface of the target.

After this preliminary discharge was completed, the shutter was removed and the coating of the aluminum substrate was started. The substrate was not heated prior to the coating.

While the coating was in process, the flow rate of the nitrogen gas introduced as a reaction gas into the device was continuously varied from 0 SCCM (standard cubic centimeter) to 4.5 SCCM over a period of 120 minutes by means of an electrically controllable flow rate adjusting meter. In this while, the partial pressure of nitrogen varied from 0 Pa to 0.086 Pa.

The film consequently obtained had an overall thickness of 3.6 $\mu$m. It was confirmed by observation through an electron microscope that the section of this film had a dense structure and showed no columnar structure.

Figure 8:
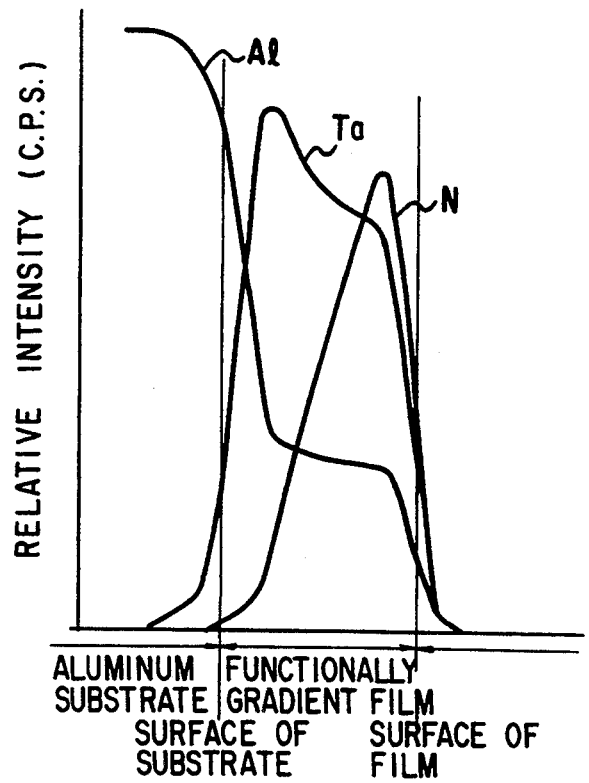
FIG. 8 is a line profile showing the variation of composition determined by the EDX in the section of an $(Al_{75}Ta_{25})_{100-x}N_x$ functionally gradient film prepared in Example 3 to be described hereinafter.
Figure 9A:
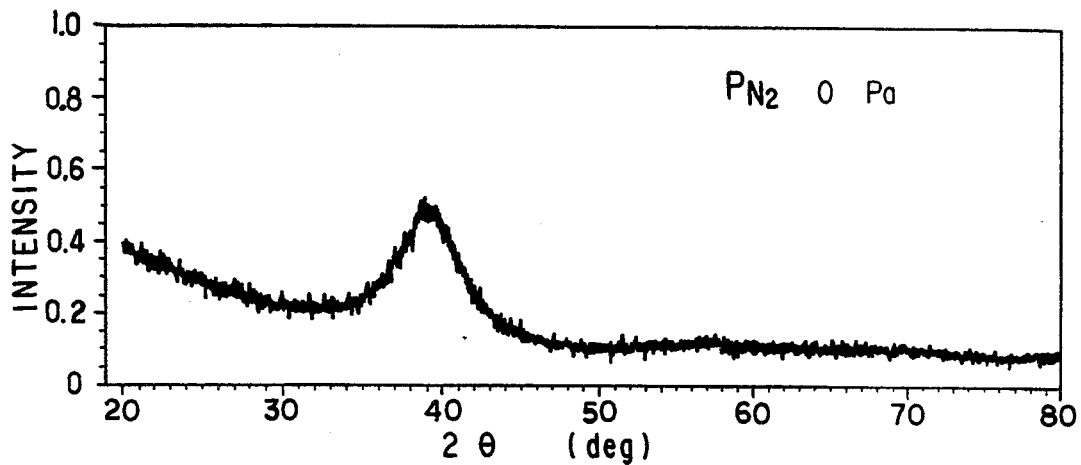
FIGS. 9A through 9E are diagrams showing the X-ray diffraction patterns obtained of films of uniform compositions of $(Al_{75}Ta_{25})_{100-x}N_x$ produced at the partial pressures of nitrogen of 0 Pa, 0.03 Pa, 0.04 Pa, 0.049 Pa, and 0.086 Pa, respectively.
Figure 9B:
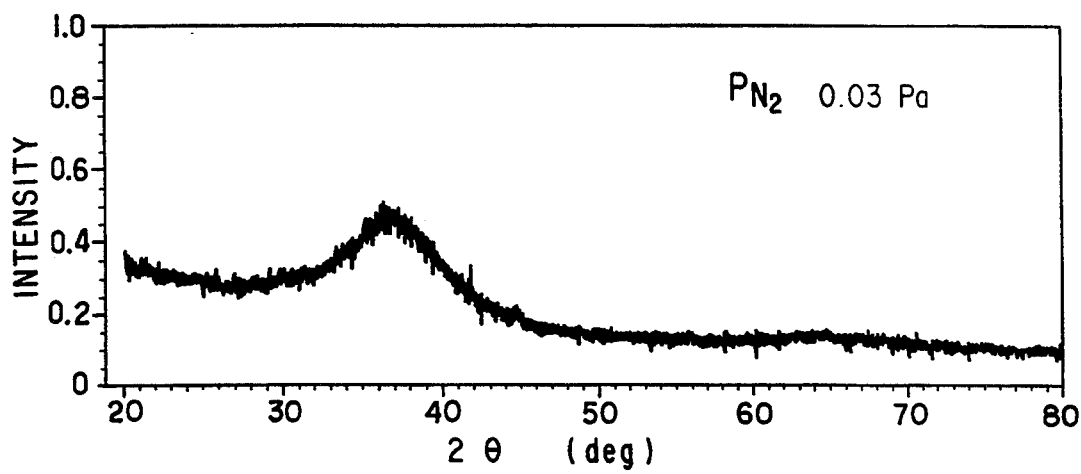
Figure 9C:
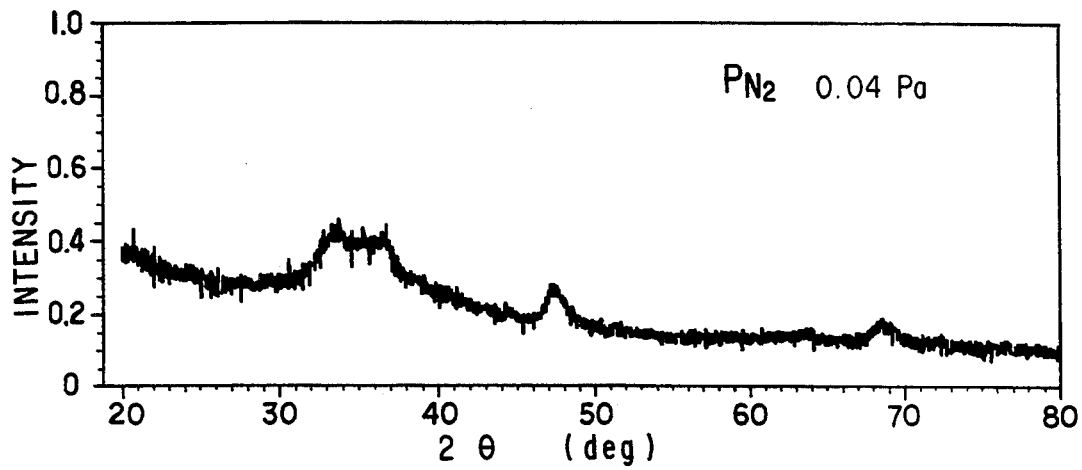
Figure 9D:
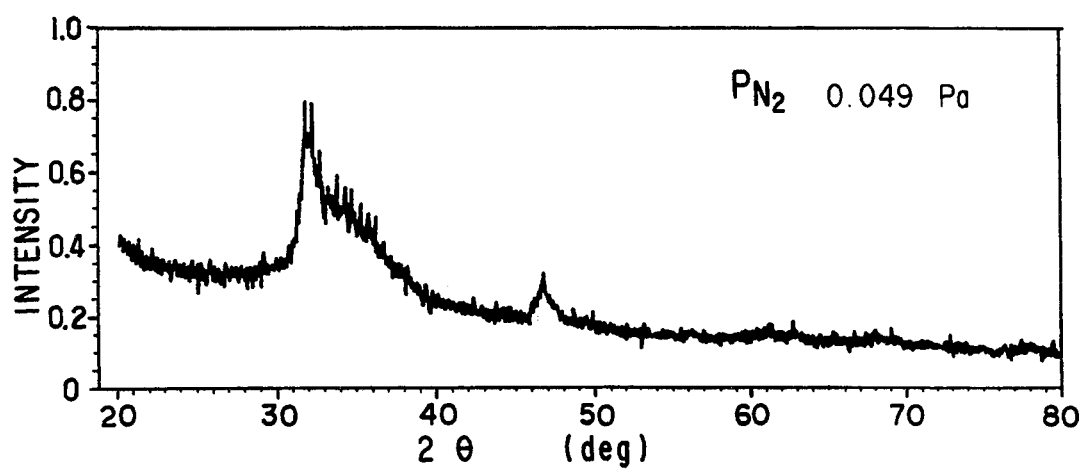
Figure 9E:
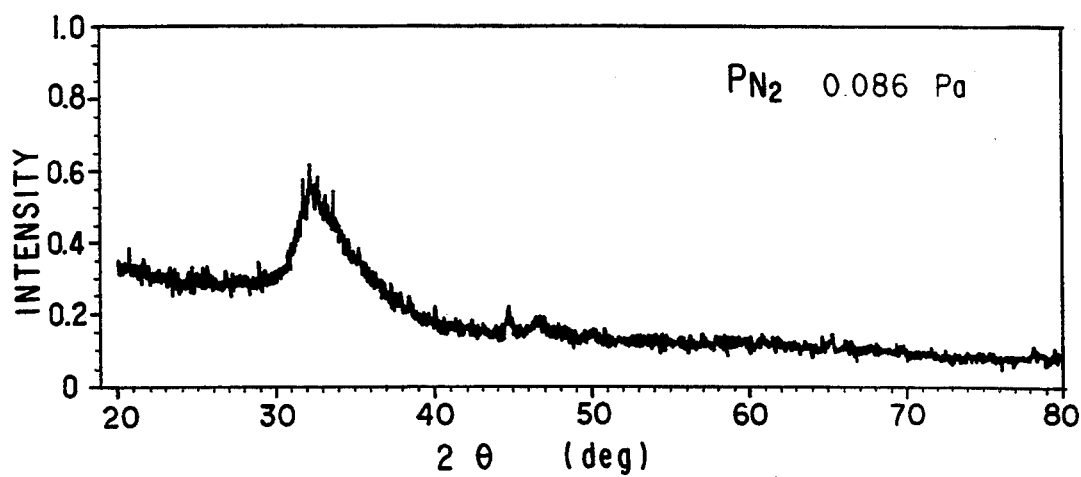

FIG. 8 represents the results of linear analysis performed by the EDX, which show a change in each component found in the section of the film obtained herein. It is clearly noted from FIG. 8 that the nitrogen content in the film continuously increased from the upper surface of the aluminum substrate to the surface of the film.

FIGS. 9A to 9E represent the results of analysis preformed by X-ray diffraction on films of uniform composition produced at varying prescribed partial pressures of nitrogen. It is clearly noted from these X-ray diffraction patterns that the film consisted of an amorphous metal at a partial pressure of nitrogen of 0 Pa and it changed from an amorphous to a crystalline structure in consequence of an increase in the partial pressure of nitrogen.

Figure 10:
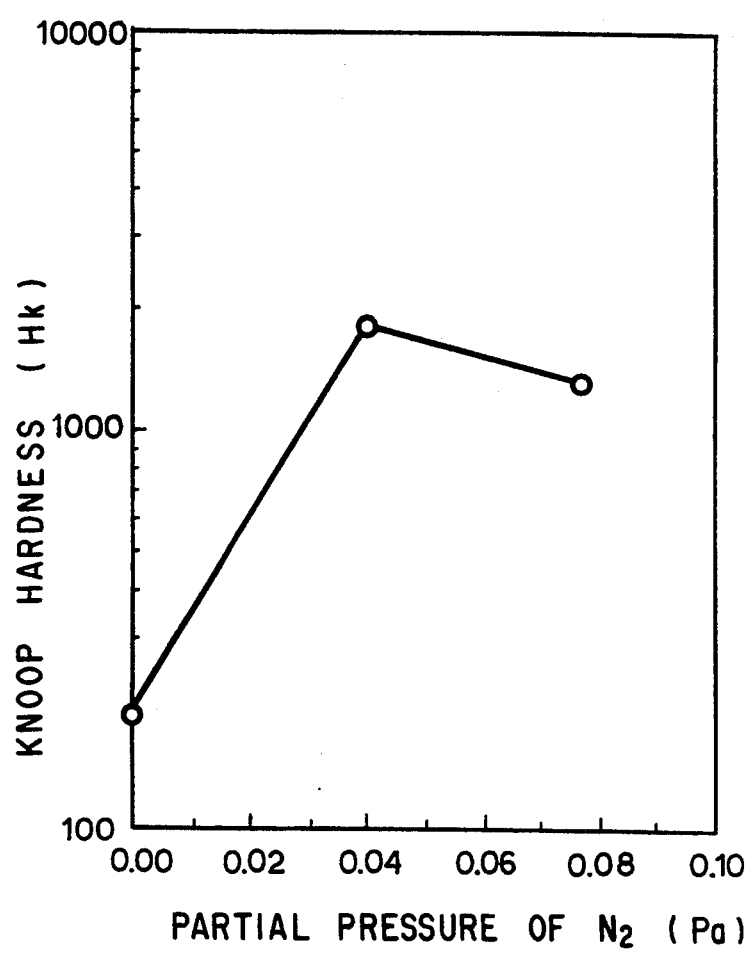
FIG. 10 is a graph showing the relation between the Knoop hardness and the partial pressure of nitrogen obtained of a film of uniform composition of $(Al_{75}Ta_{25})_{100-x}N_x$.

FIG. 10 represents the results of a test for hardness performed on films formed at varying prescribed partial pressures of nitrogen. The hardness was determined with a microhardness tester on a uniform film formed at a prescribed partial pressure of nitrogen. It is clearly noted from FIG. 10 that the hardness increased proportionately with an increase in the partial pressure of nitrogen and that the hardness reached 1,800 Hk at a partial pressure of nitrogen of 0.04 Pa.

The invention may be embodied in other specific forms without departing from the spirit or essential characteristics thereof. The described embodiments are therefore to be considered in all respects as illustrative and not restrictive, the scope of the invention being indicated by the appended claims and all changes which come within the meaning and range of equivalency of the claims are, therefore, intended to be embraced therein.

What is claimed is:

1. A hard wear-resistant film which has a composition and a structure thereof which is obliquely varied from a substantially amorphous metal of a composition of $Al_a$-$Ti_b$ (wherein "a" and "b" stand for atomic percentages respectively in the ranges of 62 at $\% \leq a \leq 85$ at $\%$ and 15 at $\% \leq b \leq 38$ at $\%$, providing $a+b=100$ at $\%$) to an (Al, Ti)N crystalline ceramic phase with a nitrogen content thereof increased in the direction of a surface of the film.

2. A hard wear-resistant film which has a composition and a structure thereof which is obliquely varied from a substantially amorphous metal of a composition of $Al_c$-$Ta_d$ (wherein "c" and "d" stand for atomic percentages respectively in the ranges of 60 at $\% \leq c \leq 80$ at $\%$ and 20 at $\% \leq d \leq 40$ at $\%$, providing $c+d=100$ at $\%$) to an (Al, Ta)N crystalline ceramic phase with a nitrogen content thereof increased in the direction of a surface of the film.

3. A hard wear-resistant film according to claim 1 or 2, wherein the nitrogen content therein is continuously increased in the direction of the surface of the film.

4. A hard wear-resistant film according to claim 1 or 2, wherein the nitrogen content therein is stepwise increased in the direction of the surface of the film.

5. A method for the production of a hard wear-resistant film, comprising the steps of:
setting in place a substrate and a material of a composition of $Al_a Ti_b$ (wherein "a" and "b" stand for atomic percentages respectively in the ranges of 62 at $\% \leq a \leq 85$ at $\%$ and 15 at $\% \leq b \leq 38$ at $\%$, providing $a+b=100$ at $\%$) as a source of evaporation in a chamber; and
effecting deposition of a film on the substrate in an atmosphere of an inert gas containing a nitrogen-containing reaction gas while varying the feed rate of the reaction gas into the chamber thereby giving rise to the film having a composition and a structure thereof obliquely varied from a substantially amorphous phase in a part contacting said substrate to an (Al, Ti)N crystalline ceramic phase forming a surface of said film.

6. A method for the production of a hard wear-resistant film, comprising the steps of:
setting in place a substrate and a material of a composition $Al_c Ta_d$ (wherein "c" and "d" stand for atomic percentages respectively in the ranges of 60 at $\% \leq c \leq 80$ at $\%$ and 20 at $\% \leq d \leq 40$ at $\%$, providing $c+d=100$ at $\%$) as a source of evaporation in a chamber; and
effecting deposition of a film on the substrate in an atmosphere of an inert gas containing a nitrogen-containing reaction gas while varying the feed rate of the reaction gas into the chamber thereby giving rise to the film having a composition and a structure thereof obliquely varied from a substantially amorphous phase in a part contacting said substrate to an (Al, Ta)N crystalline ceramic phase forming a surface of said film.

7. A method according to claim 5 or 6, wherein the deposition of said film on the substrate is carried out by a sputtering process.

8. A method according to claim 5 or 6, wherein the deposition of said film on the substrate is carried out by an ion plating process.

9. A method according to claim 5 or 6, wherein the feed rate of the reaction gas into the chamber is varied continuously.

10. A method according to claim 5 or 6, wherein the feed rate of the reaction gas into the chamber is varied stepwise.

11. A method according to claim 5 or 6, wherein said reaction gas is nitrogen gas.

12. A method according to claim 5 or 6, wherein said reaction gas is $NH_3$ gas.

13. A method according to claim 5 or 6, wherein said feed rate of the reaction gas into the chamber is controlled in such a manner that the nitrogen concentration relative to said inert gas is varied in the range of 0 to 20 vol $\%$.

14. A method according to claim 5 or 6, wherein a total pressure of said inert gas and said reaction gas is in the range of 0.6 to 1.2 Pa.

* * * * *